(12) United States Patent
Katoch

(10) Patent No.: US 8,675,433 B2
(45) Date of Patent: Mar. 18, 2014

(54) SENSE AMPLIFIER

(75) Inventor: Atul Katoch, Kanata (CA)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 196 days.

(21) Appl. No.: 13/053,660

(22) Filed: Mar. 22, 2011

(65) Prior Publication Data
US 2012/0243359 A1 Sep. 27, 2012

(51) Int. Cl.
*G11C 7/00* (2006.01)

(52) U.S. Cl.
USPC .......................................... 365/205; 365/207

(58) Field of Classification Search
USPC .................................................. 365/207, 205
See application file for complete search history.

(56) References Cited

U.S. PATENT DOCUMENTS

| | | | | |
|---|---|---|---|---|
| 6,795,328 | B2 * | 9/2004 | Kato et al. | 365/63 |
| 2003/0223261 | A1 * | 12/2003 | Kato et al. | 365/63 |
| 2009/0122630 | A1 * | 5/2009 | Takahashi | 365/207 |

* cited by examiner

*Primary Examiner* — Huan Hoang
(74) *Attorney, Agent, or Firm* — Lowe Hauptman & Ham, LLP

(57) ABSTRACT

A circuit comprises a first node, a second node, a sense amplifier, at least one first transistor, at least one second transistor, and one or a combination of a first control circuit and a second control circuit. The first control circuit is configured to generate a first control signal for at least one first gate of the at least one first transistor. The first control signal is capable of having a first voltage level lower than a first operational voltage. The second control circuit is configured to generate a second control signal for at least one second gate of the at least one second transistor. The second control signal is capable of having a second voltage level higher than a second operational voltage.

18 Claims, 5 Drawing Sheets

| Mode | SNA | SNB | SNC | SON |
|---|---|---|---|---|
| (1) Active with access | VSS | VSS | VBB | VDD |
| (2) Active with no access | VDD | VDD | VBB | VSS |
| (3) Standby | VBB | VDD | VDD | VBB |

| Mode | SPA | SPB | SPC | SOP |
|---|---|---|---|---|
| (1) Active with access | VDD | VDD | VPP2 | VSS |
| (2) Active with no access | VSS | VSS | VPP2 | VDD |
| (3) Standby | VPP2 | VSS | VSS | VPP2 |

SENSE AMPLIFIER

FIELD

The present disclosure is related to a sense amplifier.

BACKGROUND

Sense amplifiers are used abundantly in embedded Dynamic Random Access Memory (eDRAM). In some applications, the current leakage from sense amplifiers accounts for about 30% of overall leakage in a memory. As a result, there is a need to reduce the current leakage.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
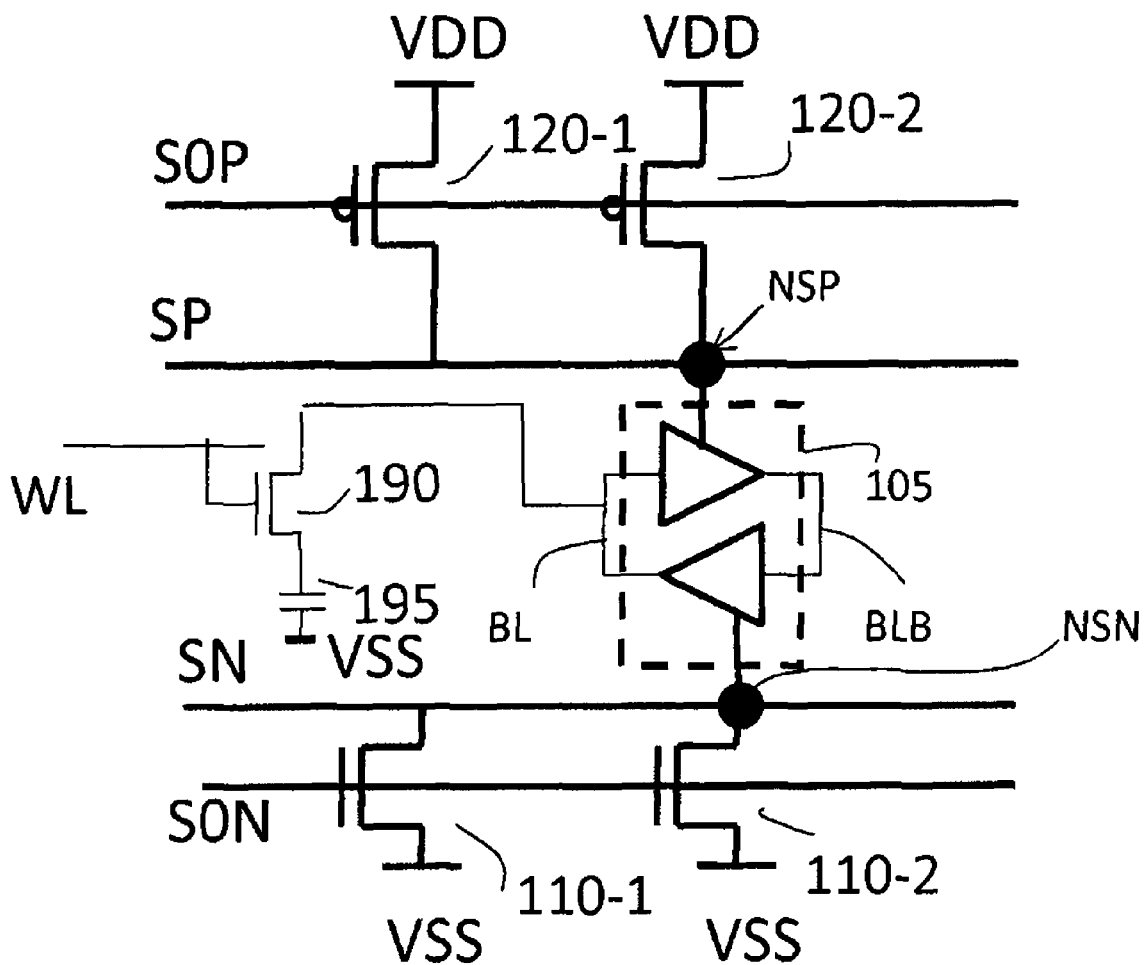
FIG. 1 is a diagram of a circuit illustrating a sense amplifier working in conjunction with a memory cell, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following features and/or advantages. Some embodiments use voltage sources VBB and VPP2 that are readily available in an eDRAM to gate bias transistors. As a result of properly controlling the gate bias, the leakage current in the sense amplifiers is significantly reduced, e.g., about 10 times improvement in some embodiments. The added die area due to the additional circuitry to reduce the leakage current is insignificant.

For simplicity, in this document, a name used for a voltage source is also used as a name for a voltage thereon. For example, VDD is used to refer to both the operational voltage VDD and the voltage source VDD. VSS is used to refer to both the reference voltage VSS and the voltage source VSS. VPP2 is used to refer to both a high voltage VPP2 and the voltage source VPP2. VBB is used to refer to both a negative voltage VBB and the voltage source VBB. In some embodiments, voltage VBB is lower than voltage VSS or is a negative voltage. Further, voltage VPP2 is higher than voltage VDD.

Exemplary Circuit

FIG. 1 is a diagram of a circuit 100, in accordance with some embodiments. Voltage VGS120 (not labeled) is the voltage dropped across the gate and the source of transistors 120. Voltage VGS110 (not labeled) is the voltage dropped across the gate and the source of transistors 110.

Word line WL turns on or off transistor 190 to allow access to memory cell 195 through NMOS transistor 190. In this document, unless otherwise stated, the term access refers to either a read access for reading data from memory cell 195 or a write access for writing data to memory cell 195. Transistor 190 allows access between sense amplifier 105 and memory cell 195 through bit lines BL. In the example of FIG. 1, transistor 190 and memory cell 195 are electrically coupled to bit line BL for illustration. Depending on implementations, some memory cells may be connected to bit line BL while some other memory cells may be connected to bit line BLB. When word line WL at the gate of transistor 190 is applied with a low logic level (a Low), word line WL turns off transistor 190 and thus electrically disconnects memory cell 195 from bit line BL or from sense amplifier 105. When word line WL is applied with a high logic level (a High), word line WL turns on transistor 190 and thus electrically connects memory cell 195 to bit line BL. In some embodiments, the high logic level of word line WL is about 1.3×VDD. In contrast, the low logic level of WL is about −0.4 V, and is provided by voltage source VBB (shown in FIG. 2).

In some embodiments, memory cell 195 is a capacitor storing charges. When memory cell 195 is electrically connected to bit line BL, memory cell 195 shares the same charge with bit line BL. Depending on the charge indicating the logic level of memory cell 195, bit line BL is pulled one way or another. For example, if memory cell 195 stores a Low, bit line BL is pulled towards ground. Conversely, if memory cell 195 stores a High, then bit line BL is pulled towards voltage VDD. After sharing the charge, the voltage difference between bit line BL and bit line BLB, commonly called a bit line split, starts to develop. The amplitude of the bit line split depends on the charge transfer ratio or capacitance of memory cell 195 and bit line BL. If bit line BL is longer and connected to a large number of memory cells, the charge ratio becomes smaller and the bit line split is reduced. Conversely, if bit line BL is shorter and connected to a small number of memory cells, the charge ratio becomes higher and the bit line split is increased.

Bit lines BL and BLB serve as both data input and output (IO) for sense amplifier 105. Each of bit line BL and BLB is coupled to the same number of memory cells 195. For illustration, however, only one bit cell 195 is shown coupled to a bit line BL. Generally, except when being pre-charged and equalized, bit lines BL and BLB are of the opposite level of one another. For example, if bit line BL is Low then bit line BLB is High. But if bit line BL is High, then bit line BLB is Low. In a write access, applying a logic level to a first bit line, and the opposite level to the other bit line, enables writing the logic level at the first bit line to memory cell 195. For example, applying a High to bit line BL and a Low to bit line BLB, enables memory cell 195 to be written with a High. Conversely, applying a Low to bit line BL and a High to bit line BLB, enables memory cell 195 to be written with a Low. In a read access, sensing or reading the logic levels at bit lines BL and BLB reveals the data stored in memory cell 195. For example, if memory cell 195 stores a High, then sensing bit line BL reveals a High. Conversely, if memory cell 195 stores a Low then sensing bit line BL reveals a Low.

Sense amplifier 105 is represented by a cross-coupled pair coupled to bit lines BL and BLB. In some embodiments, sense amplifier 105 is commonly known in the art.

Signals SP and SN are used to turn on or off sense amplifier 105. Signal SP is commonly called the positive supply voltage while signal SN is commonly called the negative voltage, even though signal SN is positive in many situations. In general, when signals SP and SN are at a same level, amplifier 105 is off, and when signal SP is at VDD and signal SN is at ground level, sense amplifier 105 is on.

The N Side

Signal SN has voltage VSS when transistors 110 are on. For example, when signal SON is applied with a High, transistors 110 are on, serving as ground paths for signal SN and sense amplifier 105. Signal SN at the drains of transistors 110 is at the same voltage level as voltage VSS at the sources of transistors 110. Alternatively stated, node NSN is at voltage VSS. When signal SON is applied with a Low, transistors 110 are off, there is no voltage VSS transferring to signal SN. Node NSN is affected by other circuitry that is not shown.

An NMOS transistor 110 is called a footer. Circuit 100 showing two NMOS transistors 110-1 and 110-2 is for illustration. The number of NMOS transistors 110 varies in various embodiments. For illustration, transistors 110-1 and 110-2 are collectively called transistors 110.

Transistors 110 are coupled in parallel. That is, the drains of transistors 110 are coupled together, and the sources of transistors 110 are coupled together. The drains of transistors 110 are also coupled to sense amplifier 105 via node NSN. The sources of transistors 110 are also coupled to voltage VSS or ground. Transistors 110 pull down signal SN. The size and the number of transistors 110 affect the pull down speed of signal SN. For example, a bigger transistor 110 and/or a larger number of transistors 110 provides a larger current through node NSN. As a result, signal SN transitions faster from a High to a Low. In contrast, a smaller transistor 110 and/or a smaller number of transistors 110 results in a slower transition from a High to a Low for signal SN.

In some embodiments, signal SON at the gates of transistors 110 is controlled to control the leakage current through transistors 110. For example, in a standby mode, signal SON is driven to voltage VBB lower than voltage VSS. As a result, voltage VGS110 is negative for NMOS transistors 110. The leakage current through NMOS transistors 110 is significantly reduced compared to the situations, for example, when signal SON is at voltage VSS or at a voltage higher than voltage VSS. Because the leakage current through transistors 110 is reduced, numerous transistors 110 can be used in circuit 100. For example, if the leakage current through a transistor 110 is large, the size of transistors 110 and/or the number of transistors 110 in circuit 100 is reduced or the total amount of leakage current through transistors 110 may cause sense amplifier 105 to function at a lower and thus undesirable speed. In some embodiments, voltage source VBB is applied to the gates of transistors 110 subject to the maximum voltage VGS110 beyond which transistors 110 would not function properly. The maximum voltage VGS110 is determined based on the corresponding technology.

In some embodiments, the number of transistors 110 used in circuit 100 is determined based on the amount of leakage current that is reduced by having signal SON at the gates of transistors 110 at voltage VBB. In other words, the number of transistors 110 used in circuit 100 is determined based on the leakage current that sense amplifier 105 can still operate at a predetermined speed, and beyond which sense amplifier 105 would not function as desired. In yet other words, the number of transistors 110 used in circuit 100 is determined based on the total leakage currents of transistors 110.

For illustration, INLeakOld is the leakage current and NNOld is the corresponding number of transistors 110, in the case signal SON switches between voltage VDD and voltage VSS. Further, INLeakNew is the leakage current and NNNew is the corresponding number of transistors, in the case signal SON switches between voltage VDD and voltage VBB in various embodiments of the present disclosure. In some embodiments, the relationship between INLeakOld, NNOld, INLeakNew, and NNNew is as follows:

$$INLeakOld*NNOld=INLeakNew*NNNew \text{ or}$$

$$INLeakOld/INleakNew=NNNew/NNOld \text{ or}$$

$$NNNew=(INLeakOld/INleakNew)*NNOld$$

For example, if INleakOld, NNOld, and INLeakNew are 1 µA, 10, 0.1 µA respectively, then $$NNNew=((1 \text{ µA})/(0.1 \text{ µA}))*10=100$$

Further, $$INLeakNew/INLeakOld=0.1 \text{ µA}/1 \text{ µA}=\tfrac{1}{10} \text{ and}$$

$$NNNew/NNOld=100/10=10$$

INLeakNew/INLeakOld being equal to ⅒ indicates the leakage current reduces ten times. NNNew/NNOld being equal to 10 indicates that that number of transistors 110 that can be used in circuit 100 increases 10 times. That is, because the leakage current is reduced ten times, the number of transistors 110 that can be used in circuit 100 increases ten times.

The P Side

Signal SP carries the operational voltage VDD when transistors 120 are on. For example, when signal SOP is applied with a Low, transistors 120 are on, signal SP at the drains of transistors 120 is at the same voltage level as voltage VDD at the sources of transistors 120. Alternatively stated, node NSP is at voltage VDD. When signal SOP is applied with a High, transistors 120 are off, there is no voltage VDD transferring to signal SP. Node NSP is affected by other circuitry that is not shown.

A PMOS transistor 120 is called a header. Circuit 100 showing two PMOS transistors 120-1 and 120-2 is for illustration. The number of PMOS transistors 120 varies in various embodiments. For illustration, transistors 120-1 and 120-2 are collectively called transistors 120.

Transistors 120 are coupled in parallel. That is, the drains of transistors 120 are coupled together, and the sources of transistors 120 are coupled together. The drains of transistors 120 are also coupled to sense amplifier 105 via node NSP. The sources of transistors 120 are also coupled to voltage VDD. Transistors 120 pull up signal SP. The size and the number of transistors 120 affect the pull up speed of signal SP. For example, a bigger transistor 120 and/or a larger number of transistors 120 provides a larger current through node NSP. As a result, signal SP transitions faster from a Low to a High. In contrast, a smaller transistor 120 and/or a smaller number of transistors 120 results in a slower transition from a Low to a High for signal SP.

In some embodiments, signal SOP at the gates of transistors 120 is controlled to control the leakage current through transistors 120. For example, in a standby mode, signal SOP is driven to voltage VPP2 higher than voltage VDD. As a result, voltage VGS120 is positive for PMOS transistors 120. Consequently, the leakage current through PMOS transistors 120 is significantly reduced compared to the situations when, for example, signal SOP is at voltage VDD or at a voltage lower than voltage VDD. Because the leakage current through transistors 120 is reduced, numerous transistors 120 can be used in circuit 100. For example, if the leakage current through a transistor 120 is large, the number of transistors 120 in circuit 100 is reduced or the total amount of leakage current through transistors 120 may cause sense amplifier 105 to function at a lower and thus undesirable speed. In some embodiments, voltage source VPP2 is used to provide the high voltage level for signal SOP. Voltage VPP2 is applied subject to the maximum voltage VGS120 beyond which transistors 120 would not function properly. The maximum voltage VGS120 is determined based on the corresponding technology.

In some embodiments, the number of transistors 120 used in circuit 100 is determined based on the amount of leakage current that is reduced based by controlling signal SOP at the gates of transistors 120 to voltage VPP2. In other words, the number of transistors 120 used in circuit 100 is determined based on the leakage current that sense amplifier 105 can still operate efficiently, and beyond which sense amplifier 105 would not function properly. In yet other words, the number of transistors 120 used in circuit 100 is determined based on the total leakage currents of transistors 120.

For illustration, IPLeakOld is the leakage current and NPOld is the corresponding number of transistors 120, in the case signal SOP switches between voltage VSS and voltage VDD. Further, IPLeakNew is the leakage current and NPNew is the corresponding number of transistors, in the case signal SOP switches between voltage VSS and voltage VPP2. In some embodiments, the relationship between IPLeakOld, NPOld, IPLeakNew, and NPNew is as follows:

$IPLeakOld*NPOld=IPLeakNew*NPNew$ or $IPLeakOld/IpleakNew=NPNew/NPOld$ or $NPNew=(IPLeakOld/IPLeakNew)*NPOld$ For example, if IPLeakOld, NPOld, and IPLeakNew are 1 µA, 10, 0.1 µA respectively, then $NPNew=((1 µA)/(0.1 µA))*10=100$ Further, $IPLeakNew/IPLeakOld=0.1 µA/1 µA=1/10$ and $NPNew/NPOld=100/10=10$ IPLeakNew/IPLeakOld being equal to 1/10 indicates that the leakage current reduces ten times. NPNew/NPOld being equal to 10 indicates that the number of transistors 120 that can be used in circuit 100 increases ten times. That is, because the leakage current is reduced ten times, the number of transistors 120 that can be used in circuit 100 increases ten times.

Exemplary Circuit Generating Signal Son

Figures 2A, 2B:
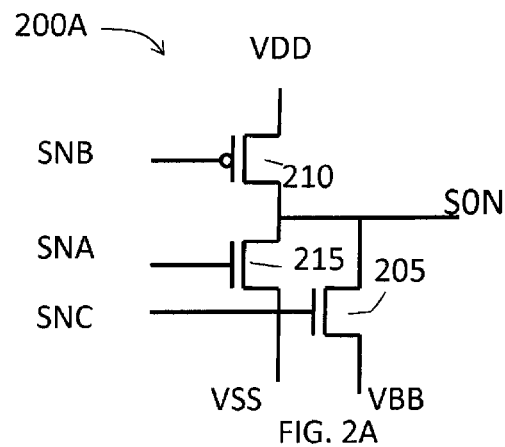
FIG. 2A is a diagram of a circuit that generates signal SON, in accordance with some embodiments.
FIG. 2B is a table illustrating an operation of the circuit in FIG. 2A, in accordance with some embodiments.

FIG. 2A is a diagram of a circuit 200A used to generate signal SON, in accordance with some embodiments. FIG. 2B is a table 200B illustrating an operation of circuit 200A, in accordance with some embodiments.

On line (1) of table 200B, circuit 100 is in the active mode with an access. Signal SNA at the gate of NMOS transistor 215 is at voltage VSS. As a result, NMOS transistor 215 is off. Signal SNC at the gate of NMOS transistor 205 is at voltage VBB. The source of NMOS transistor 205 is also at voltage VBB. As a result, NMOS transistor 205 is off. Signal SNB at the gate of PMOS transistor 210 is at voltage VSS. As a result, PMOS transistor 210 is on. Consequently, signal SON at the drain of transistor 210 is pulled to voltage VDD at the source of transistor 210.

On line (2) of table 200B, circuit 100 is in the active mode without an access. Signal SNB at the gate of PMOS transistor 210 is at voltage VDD. As a result, PMOS transistor 210 is off. Signal SNC at the gate of NMOS transistor 205 is at voltage VBB. The source of NMOS transistor 205 is also at voltage VBB. As a result, NMOS transistor 205 is off. Signal SNA at the gate of NMOS transistor 215 is at voltage VDD. As a result, NMOS transistor 215 is on. Consequently, signal SON at the drain of transistor 215 is pulled to voltage VSS at the source of transistor 215.

On line (3) of table 200B, circuit 100 is in the standby mode. Signal SNB at the gate of PMOS transistor 210 is at voltage VDD. As a result, PMOS transistor 210 is off. Signal SNC at the gate of NMOS transistor 205 is at voltage VDD. As a result, signal SON at the drain of transistor 205 is pulled to voltage VBB at the source of transistor 205. Signal SON at voltage VBB at the drain of transistor 205 is also at the drain of transistor 215. Signal SNA at the gate of transistor 215 is at voltage VBB. Consequently, transistor 215 is off.

Exemplary Circuit Generating Signal SOP

Figures 3A, 3B:
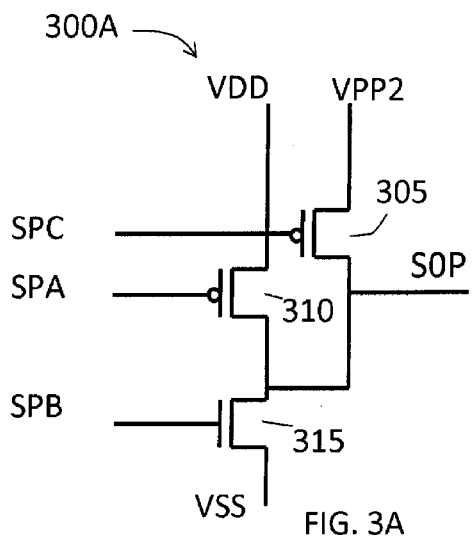
FIG. 3A is a diagram of a circuit that generates signal SOP, in accordance with some embodiments.
FIG. 3B is a table illustrating an operation of the circuit in FIG. 3A, in accordance with some embodiments.

FIG. 3A is a diagram of a circuit 300A used to generate signal SOP, in accordance with some embodiments. FIG. 3B is a table 300B illustrating an operation of circuit 300A, in accordance with some embodiments.

On line (1) of table 300B, circuit 100 is in the active mode with an access. Signal SPA at gate of PMOS transistor 310 is at voltage VDD. As a result, PMOS transistor 310 is turned off. Signal SPC at the gate of PMOS transistor 305 is at voltage VPP2. As a result, transistor 305 is turned off. Signal SPB at the gate of NMOS transistor 315 is High. As a result, NMOS transistor 315 is turned on. Consequently, signal SOP at the drain of transistor 315 is pulled to voltage VSS at the source of transistor 315.

On line (2) of table 300B, circuit 100 is in the active mode, but there is no access. Signal SPB at the gate of NMOS transistor 315 is at voltage VSS. As a result, NMOS transistor 315 is off. Signal SPC at the gate of PMOS transistor 305 is at voltage VPP2. As a result, transistor 305 is off. Signal SPA at the gate of PMOS transistor 310 is at voltage VSS. As a result, PMOS transistor 310 is on. Consequently, signal SOP at the drain of transistor 310 is pulled to voltage VDD at the source of transistor 310.

On line (3) of table 300B, circuit 100 is in the standby mode. Signal SPB at the gate of NMOS transistor 315 is at voltage VSS. As a result, NMOS transistor 315 is off. Signal SPC at the gate of PMOS transistor 305 is at voltage VSS. As a result, PMOS transistor 305 is on. Consequently, signal SOP at the drain of transistor 305 is pulled to voltage VPP2 at the source of transistor 305. Signal SPA at the gate of PMOS transistor 310 is at voltage VPP2. Signal SOP at the drain of transistor 305 also at the drain of transistor 310 is at voltage VPP2. As a result, PMOS transistor 310 is off.

In some embodiments, voltage source VBB is used to provide a voltage level to turn off word lines WL in a dynamic random access memory (DRAM). Further, voltage source VPP2 is used to provide a voltage level to equalize bit lines BL and BLB of the same DRAM. Various embodiments are advantageous because voltage sources VBB and VPP2 are readily available to be used in circuits 300A and 300B as explained above.

Operation of Circuit 100

Based on lines (1) of both tables 200B and 300B, circuit 100 is in the active mode with an access when signal SON is at voltage VDD and signal SOP is at voltage VSS. Because signal SON is at voltage VDD and voltage SOP is at voltage VSS, the respective transistors 110 and 120 in FIG. 1 are on. Consequently, node NSN is at voltage VSS while node NSP is at voltage VDD.

Based on lines (2) of both tables 200B and 300B, circuit 100 is in the active mode without an access when signal SON is at voltage VSS and signal SOP is at voltage VDD. Because signal SON is at voltage VSS and signal SOP is at voltage VDD, the respective transistors 110 and 120 in FIG. 1 are off. Consequently, both nodes NSN and NSP are controlled by other circuitry that is not shown.

Based on lines (3) of both tables 200B and 300B, circuit 100 is in the standby mode when signal SON is at voltage VBB and signal SOP is at voltage VPP2. In some embodiments, during the standby mode bit lines BL and BLB are pre-charged to about 0.5 VDD. Because signal SON is at voltage VBB, the leakage current through transistors 110 is insignificant or significantly reduced compared to other approaches. Similarly, because signal SOP is at voltage VPP2, the leakage current through transistors 120 is insignificant. Consequently, the leakage current of sense amplifier 105 is insignificant.

Some embodiments are advantageous over other approaches. In those approaches, signals SN and SP are pre-charged to 0.5 VDD. With respect to transistors 110, currents leaks from 0.5 VDD to ground. With respect to transistors 120, currents leak from VDD to 0.5 VDD. Specifically, the leakage currents in transistors 110 and 120 and thus in a memory are significant when there are a large number of sense amplifiers 105 in the memory. Ten thousands of sense amplifiers 105 in a memory array are not unusual.

Circuits 200A and 300A are used for illustration. Circuitry other than circuit 200A configured to generate signal SON at the different voltage level VBB, VSS, and VDD is within the scope of various embodiments. For example, circuitry configured to generate voltage SON at the gates of NMOS transistors 110 that is lower than voltage VSS or the voltage at the sources of NMOS transistors is within the scope of various embodiments. Similarly, circuitry other than circuit 300A configured to generate signal SOP at different voltage levels VPP2, VSS, and VDD is within the scope of various embodiments. For example, circuitry configured to generate voltage SOP at the gates of PMOS transistors 120 that is higher than voltage VDD or the voltage at the sources of PMOS transistors 120 is within the scope of various embodiments.

Exemplary Method and Corresponding Waveforms

Figure 4:
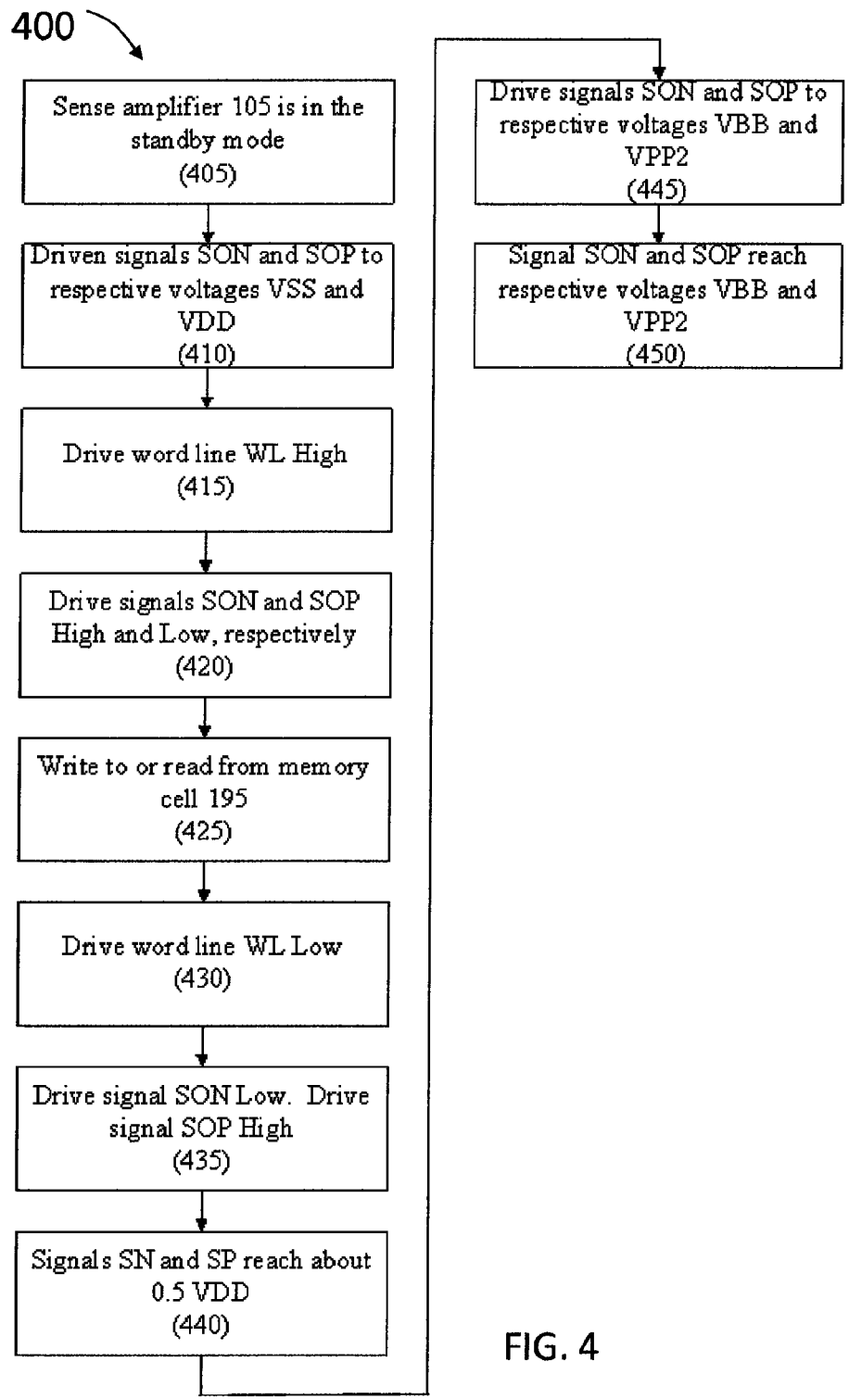
FIG. 4 is a flowchart illustrating an operation of the circuit in FIG. 1, in accordance with some embodiments.
Figure 5:
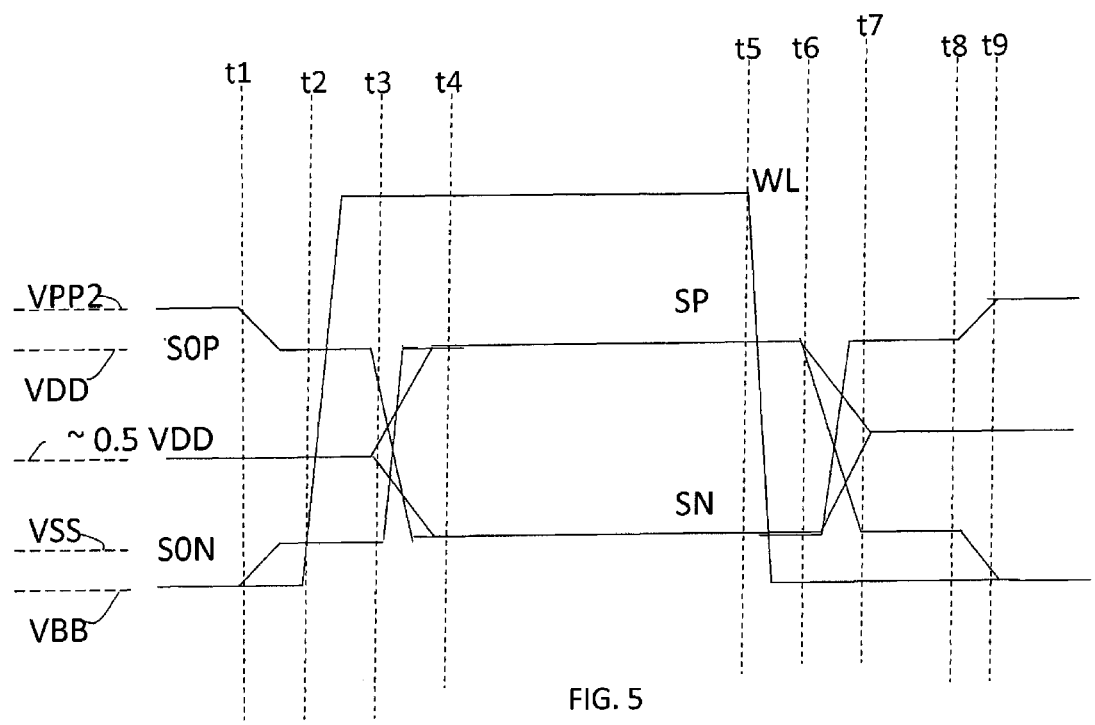
FIG. 5 is a graph of waveforms illustrating the behavior of various signals in response to the steps in FIG. 4, in accordance with some embodiments.

FIG. 4 is a flow chart 400 illustrating a method of operating circuit 100, in accordance with some embodiments. FIG. 5 is a graph of waveforms illustrating the behavior of various signals in response to the steps in FIG. 4.

In step 405, before time t1, sense amplifier 105 is in the standby mode. Signal SOP has been driven to and settled at voltage VPP2. Signal SON has been driven to and settled at voltage VBB.

In step 410, at time t1, an access to memory cell 195 is identified. Signals SON and SOP are therefore driven to voltage VSS voltage VDD, respectively.

In step 415, at time t2, soon after signal SOP and signal SON have settled at respective voltages VDD and VSS, word line WL is driven High to electrically couple memory cell 195 to bit line BL. A bit line split between bit lines BL and BLB starts to develop.

In step 420, at time t3, signals SON and SOP are driven High and Low, respectively. As a result, signals SN and SP change towards respective voltages VSS and VDD.

In step 425, at time t4, signals SN and SP have settled at respective voltages VSS and VDD. As a result, sense amplifier 105 is on. At this time, writing to or reading from memory 195 is performed.

In step 430, at time t5, word line WL is driven Low to electrically disconnect memory cell 195 from bit line BL.

In step 435, at time t6, soon after word line WL is driven Low, signal SON is driven to voltage VSS and signal SOP is driven to voltage VDD. Sense amplifier 105 is therefore off. At the same time, signals SN and SP are charged to about 0.5 VDD.

In step 440, at time t7, signals SN and SP reach about 0.5 VDD.

In step 445, at time t8, signals SON and SOP are driven to respective voltages VBB and VPP2.

In step 450, at time t9 signals SON and SOP reach respective voltages VBB and VPP2.

In the above illustration, in some embodiments, memory cell 195 is in the active but without an access mode between times t6 and t8. Before time t1 and after time t9, memory cell 195 is in the standby mode. Between times t2 and t5, memory cell 195 is in the active with an access mode. Between times t1 and t2, t5 and t7, t8 and t9 memory cell 195 is in the transitioning mode. In some embodiments, the time for a transitioning mode is insignificant compared with the time for other modes.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logic level (e.g., Low or High) of the various signals used in the above description is also for illustration purposes. Various embodiments are not limited to a particular level when a signal is activated and/or deactivated. Selecting different levels is within the scope of various embodiments. In various situations, a transistor functions as a switch. As a result, using a switch, a switching circuitry, etc., is within the scope of various embodiments.

Some embodiments regard a circuit comprising a first node, a second node, a sense amplifier, at least one first transistor, at least one second transistor, and one or a combination of a first control circuit and a second control circuit. The first node is configured to receive a first operational voltage. The second node is configured to receive a second operational voltage. The sense amplifier has a first supply voltage node and a second supply voltage node. The at least one first transistor has at least one first drain, at least one first source, and at least one first gate. The at least one first drain is coupled to the first supply voltage node. The at least one first source is configured to receive the first operational voltage. The at least one second transistor has at least one second drain, at least one second source, and at least one second gate. The at least one second drain is coupled to the second supply voltage node. The at least one second source is configured to receive the second operational voltage. The first control circuit is configured to generate a first control signal for the at least one first gate. The first control signal is capable of having a first voltage level lower than the first operational voltage. The second control circuit is configured to generate a second control signal for the at least one second gate. The second control signal is capable of having a second voltage level higher than the second operational voltage.

Some embodiments regard a method wherein a memory cell is electrically disconnected from a data line. A sense amplifier coupled to the data line and having a first supply voltage node and a second supply voltage node is turned off. A first control signal is driven to a first control first voltage level. A second control signal is driven to a second control first voltage level. The first control signal is driven to a first control second voltage level lower than the first control first voltage level, and/or the second control signal is driven to a second control second voltage level higher than the second control first voltage level. The first control signal is for at least one gate of at least one first transistor coupled to the first supply voltage node. The second control signal is for at least one gate of at least one second transistor coupled to the second supply voltage node.

Some embodiments regard a circuit comprising a sense amplifier having a first supply voltage node and a second supply voltage node, at least one first transistor having at least one first drain, at least one first source, and at least one first gate, at least one second transistor having at least one second drain, at least one second source, and at least one second gate, and one or a combination of a first control circuit and a second control circuit. The at least one first transistor is coupled to the first supply voltage node. The at least one second transistor is coupled to the second supply voltage node. The first control circuit includes a first control PMOS transistor, a first control first NMOS transistor, and a first control second NMOS transistor. The first control PMOS transistor has a first control PMOS drain, a first control PMOS source, and a first control PMOS gate. The first control first NMOS transistor has a first control first NMOS drain, a first control first NMOS source, and a first control first NMOS gate. The first control second NMOS transistor has a first control second NMOS drain, a first control second NMOS source, and a first control second NMOS gate. The first control PMOS source is coupled to a first supply voltage source. The first control PMOS drain is coupled to the first control first NMOS drain and the first control second NMOS drain, and is configured to provide a first control signal for the at least one first gate. The first control first NMOS source is coupled to a second supply voltage source. The first control second NMOS source is coupled to a third supply voltage source. The third supply voltage source is capable of providing a voltage less than a first operational voltage. The second control circuit includes a second control NMOS transistor, a second control first PMOS transistor, and a second control second PMOS transistor. The second control NMOS transistor has a second control NMOS drain, a second control NMOS source, and a second control NMOS gate. The second control first PMOS transistor has a second control first PMOS drain, a second control first PMOS source, and a second control first PMOS gate. The second control second PMOS transistor has a second control second PMOS drain, a second control second PMOS source, and a second control second PMOS gate. The second control first PMOS source is coupled to the first supply voltage source. The second control first PMOS drain is coupled to the second control NMOS drain and the second control second PMOS source, and is configured to provide the second control signal. The second control second PMOS source is coupled to a fourth supply voltage source. The second control NMOS source is coupled to the second supply voltage source. The fourth supply voltage source is capable of providing a voltage higher than the second operational voltage.

The above methods show exemplary steps, but they are not necessarily performed in the order shown. Steps may be added, replaced, changed order, and/or eliminated as appropriate, in accordance with the spirit and scope of disclosed embodiments.

What is claimed is:

1. A circuit comprising:
   a first node configured to receive a first operational voltage;
   a second node configured to receive a second operational voltage, the second operational voltage being greater than the first operational voltage;
   a sense amplifier having a first supply voltage node and a second supply voltage node;
   at least one first transistor having at least one first drain, at least one first source, and at least one first gate, the at least one first drain coupled to the first supply voltage node, the at least one first source configured to receive the first operational voltage;
   at least one second transistor having at least one second drain, at least one second source, and at least one second gate, the at least one second drain coupled to the second supply voltage node, the at least one second source configured to receive the second operational voltage; and
   at least one of
      a first control circuit configured to generate a first control signal for the at least one first gate, the first control signal capable of having a first voltage level lower than the first operational voltage; or
      a second control circuit configured to generate a second control signal for the at least one second gate, the second control signal capable of having a second voltage level higher than the second operational voltage,
   wherein the circuit is configured to meet at least one of the following conditions:
      a first number of first transistors of the at least one first transistor is selected based on a first current leakage through the at least one first transistor when the first voltage level of the first control signal is less than the first operational voltage; or
      a second number of second transistors of the at least one second transistor is selected based on a second current leakage through the at least one second transistor when the second voltage level of the second control signal is greater than the second operational voltage.

2. The circuit of claim 1, wherein
   the first control circuit includes
      a first control PMOS transistor having a first control PMOS drain, a first control PMOS source, and a first control PMOS gate;
      a first control first NMOS transistor having a first control first NMOS drain, a first control first NMOS source, and a first control first NMOS gate; and
      a first control second NMOS transistor having a first control second NMOS drain, a first control second NMOS source, and a first control second NMOS gate,
   wherein
      the first control PMOS source is coupled to a first supply voltage source;

the first control PMOS drain is coupled to the first control first NMOS drain and the first control second NMOS drain, and is configured to provide the first control signal;

the first control first NMOS source is coupled to a second supply voltage source;

the first control second NMOS source is coupled to a third supply voltage source; and the third supply voltage source is capable of providing a voltage less than the first operational voltage;

the second control circuit includes a second control NMOS transistor having a second control NMOS drain, a second control NMOS source, and a second control NMOS gate;

a second control first PMOS transistor having a second control first PMOS drain, a second control first PMOS source, and a second control first PMOS gate; and a second control second PMOS transistor having a second control second PMOS drain, a second control second PMOS source, and a second control second PMOS gate wherein the second control first PMOS source is coupled to the first supply voltage source;

the second control first PMOS drain is coupled to the second control NMOS drain and the second control second PMOS drain, and is configured to provide the second control signal;

the second control second PMOS source is coupled to a fourth supply voltage source;

the second control NMOS source is coupled to the second supply voltage source; and the fourth supply voltage source is capable of providing a voltage higher than the second operational voltage.

3. The circuit of claim 2, wherein each of the first control PMOS gate, the first control first NMOS gate, the first control second NMOS gate, the second control NMOS gate, the second control first PMOS gate, and the second control second PMOS gate is coupled to different respective control signals.

4. The circuit of claim 2, wherein the third supply voltage source and the fourth supply voltage source are provided in a dynamic random access memory.

5. The circuit of claim 1, wherein the circuit is configured to meet at least one of the following conditions:

a first voltage dropped across the at least one first gate and the at least one first source is configured in relation to a first predetermined voltage dropped across the at least one first gate and the at least one first source when the first voltage level of the first control signal is less than the first operational voltage; or a second voltage dropped across the at least one second gate and the at least one second source is configured in relation to a second predetermined voltage dropped across the at least one second gate and the at least one second source when the second voltage level of the second control signal is greater than the second operational voltage.

6. The circuit of claim 1, further comprising a pair of data lines coupled to the sense amplifier.

7. The circuit of claim 6, further comprising a first plurality of memory cells coupled to a first data line of the pair of data lines and a second plurality of memory cells coupled to a second data line of the pair of data lines.

8. A method comprising:

electrically disconnecting a memory cell from a first data line;

turning off a sense amplifier, the sense amplifier coupled to the first data line and having a first supply voltage node and a second supply voltage node, the turning off the sense amplifier comprising:

driving a first control signal to a first control first voltage level; and driving a second control signal to a second control first voltage level, the second control first voltage level being greater than the first control first voltage level; and performing at least one of the following steps:

driving the first control signal to a first control second voltage level lower than the first control first voltage level; and driving the second control signal to a second control second voltage level higher than the second control first voltage level, wherein the first control signal is for at least one gate of at least one first transistor coupled to the first supply voltage node; and the second control signal is for at least one gate of at least one second transistor coupled to the second supply voltage node, wherein at least one of the following conditions is met:

the at least one first transistor includes a first number of first transistors based on a first leakage current when the first control second voltage level is lower than the first control first voltage level; or the at least one second transistor includes a second number of second transistors based on a second leakage current when the second control second voltage level is higher than the second control first voltage level.

9. The method of claim 8, further comprising:

passing the first control first voltage level from a first voltage source to the first control signal to drive the first control signal to the first control first voltage level;

passing the second control first voltage level from a second voltage source to the second control signal to drive the second control signal to the second control first voltage level; and at least one of the following steps:

passing the first control second voltage level from a third voltage source to the first control signal to drive the first control signal to the first control second voltage level; or passing the second control second voltage level from a fourth voltage source to the second control signal to drive the second control signal to the second control second voltage level.

10. The method of claim 8, wherein at least one of the following conditions is met:

the first control second voltage level is determined based on a first predetermined voltage dropped across at least one gate and at least one source of the at least one first transistor; or the second control second voltage level is determined based on a second predetermined voltage dropped across at least one gate and at least one source of the at least one second transistor.

11. The method of claim 8, wherein the first control signal is generated based on a first circuit that includes a first control PMOS transistor having a first control PMOS drain, a first control PMOS source, and a first control PMOS gate;

a first control first NMOS transistor having a first control first NMOS drain, a first control first NMOS source, and a first control first NMOS gate; and a first control second NMOS transistor having a first control second NMOS drain, a first control second NMOS source, and a first control second NMOS gate, wherein
the first control PMOS source is coupled to a first supply voltage source;
the first control PMOS drain is coupled to the first control first NMOS drain and the first control second NMOS drain, and is configured to provide the first control signal;
the first control first NMOS source is coupled to a second supply voltage source;
the first control second NMOS source is coupled to a third supply voltage source; and
the third supply voltage source is capable to provide a voltage less than a first operational voltage; and the second control signal is generated based on a second circuit that includes
a second control NMOS transistor having a second control NMOS drain, a second control NMOS source, and a second control NMOS gate;
a second control first PMOS transistor having a second control first PMOS drain, a second control first PMOS source, and a second control first PMOS gate; and
a second control second PMOS transistor having a second control second PMOS drain, a second control second PMOS source, and a second control second PMOS gate, wherein
the second control first PMOS source is coupled to the first supply voltage source;
the second control first PMOS drain is coupled to the second control NMOS drain and the second control second PMOS drain, and is configured to provide the second control signal;
the second control second PMOS source is coupled to a fourth supply voltage source;
the second control NMOS source is coupled to the second supply voltage source; and
the fourth supply voltage source is capable of providing a voltage higher than a second operational voltage.

12. The method of claim 11 wherein the third supply voltage source and the fourth supply voltage source are provided in a dynamic random access memory.

13. The method of claim 8 further comprising driving a second data line from a first state to a second state to electrically disconnect the memory cell from the first data line.

14. The method of claim 8, further comprising driving the first supply voltage node and the second voltage supply node to a predetermined voltage level.

15. A circuit comprising:
a sense amplifier having a first supply voltage node and a second supply voltage node;
at least one first transistor having at least one first drain, at least one first source, and at least one first gate;
at least one second transistor having at least one second drain, at least one second source, and at least one second gate; and
one or a combination of a first control circuit and a second control circuit, wherein
the at least one first transistor is coupled to the first supply voltage node;
the at least one second transistor is coupled to the second supply voltage node;
the first control circuit includes
a first control PMOS transistor having a first control PMOS drain, a first control PMOS source, and a first control PMOS gate;
a first control first NMOS transistor having a first control first NMOS drain, a first control first NMOS source, and a first control first NMOS gate; and
a first control second NMOS transistor having a first control second NMOS drain, a first control second NMOS source, and a first control second NMOS gate;
the first control PMOS source is coupled to a first supply voltage source;
the first control PMOS drain is coupled to the first control first NMOS drain and the first control second NMOS drain, and is configured to provide a first control signal for the at least one first gate;
the first control first NMOS source is coupled to a second supply voltage source;
the first control second NMOS source is coupled to a third supply voltage source;
the third supply voltage source is capable of providing a voltage less than a first operational voltage;
the second control circuit includes
a second control NMOS transistor having a second control NMOS drain, a second control NMOS source, and a second control NMOS gate;
a second control first PMOS transistor having a second control first PMOS drain, a second control first PMOS source, and a second control first PMOS gate; and
a second control second PMOS transistor having a second control second PMOS drain, a second control second PMOS source, and a second control second PMOS gate;
the second control first PMOS source is coupled to the first supply voltage source;
the second control first PMOS drain is directly coupled to the second control NMOS drain and the second control second PMOS drain, and is configured to provide a second control signal;
the second control second PMOS source is coupled to a fourth supply voltage source;
the second control NMOS source is coupled to the second supply voltage source; and
the fourth supply voltage source is capable of providing a voltage higher than a second operational voltage.

16. The circuit of claim 15, wherein the third supply voltage source and/or the fourth supply voltage source is from a dynamic random access memory.

17. The circuit of claim 15 further comprising:
a first data line coupled to the sense amplifier;
a first plurality of memory cells coupled to the first data line;
a second data line coupled to the sense amplifier; and
a second plurality of memory cells coupled to the second data line.

18. The method of claim 14, wherein the driving the first supply voltage node and the second voltage supply node to the predetermined voltage level is performed after the turning off the sense amplifier.

* * * * *